United States Patent
Huang et al.

(10) Patent No.: US 9,155,205 B2
(45) Date of Patent: Oct. 6, 2015

(54) ELECTRONIC DEVICE AND FABRICATION METHOD THEREOF

(71) Applicant: National Taipei University of Technology, Taipei (TW)

(72) Inventors: Chien-Yi Huang, Taipei (TW); Pin-Jou Liao, Taipei (TW)

(73) Assignee: National Taipei University of Technology, Taipei (TW)

( * ) Notice: Subject to any disclaimer, the term of this patent is extended or adjusted under 35 U.S.C. 154(b) by 0 days.

(21) Appl. No.: 14/134,096

(22) Filed: Dec. 19, 2013

(65) Prior Publication Data
US 2014/0177177 A1    Jun. 26, 2014

(30) Foreign Application Priority Data
Dec. 25, 2012 (TW) .............................. 101149706 A

(51) Int. Cl.
| H05K 1/00 | (2006.01) |
| H05K 1/18 | (2006.01) |
| H05K 1/11 | (2006.01) |
| H05K 3/22 | (2006.01) |
| H05K 1/14 | (2006.01) |

(52) U.S. Cl.
CPC ............... *H05K 3/225* (2013.01); *H05K 1/142* (2013.01); *H05K 2201/0919* (2013.01); *H05K 2201/09127* (2013.01); *H05K 2201/09618* (2013.01); *H05K 2201/09827* (2013.01); *H05K 2201/09836* (2013.01); *H05K 2203/175* (2013.01); *H05K 2203/176* (2013.01); *Y10T 29/4913* (2015.01)

(58) Field of Classification Search
CPC ............... H05K 2203/176; H05K 2201/2018; H05K 2201/0909; H05K 2201/09127; H05K 2201/09109; H05K 1/142

USPC .................................. 361/748; 174/254, 262
See application file for complete search history.

(56) References Cited

U.S. PATENT DOCUMENTS

| 3,778,681 | A | * | 12/1973 | Wilson .......................... 361/785 |
| 4,549,200 | A | * | 10/1985 | Ecker et al. .................... 174/260 |
| 5,233,754 | A | * | 8/1993 | Matsunaga et al. .............. 29/848 |
| 5,378,314 | A | * | 1/1995 | Schmidt et al. ................. 216/18 |

(Continued)

FOREIGN PATENT DOCUMENTS

| KR | 10-1064146 B1 | * | 9/2011 |
| TW | I251927 B | | 3/2006 |
| WO | WO 2011105670 A1 | * | 9/2011 |

OTHER PUBLICATIONS

KR 10-1064146, Park J, Sep. 16, 2011, Machine translation provided by KIPO.*

(Continued)

*Primary Examiner* — Jeremy C Norris
*Assistant Examiner* — Nathan Milakovich
(74) *Attorney, Agent, or Firm* — McCarter & English, LLP; Yu Lu

(57) ABSTRACT

An electronic device is disclosed. The electronic device includes at least an electronic element; and a circuit board having a base with at least a block, wherein the at least a block is used as a replaceable carrying portion for carrying the electronic element, and the electronic element is electrically connected to the circuit board. As such, when a defect occurs to the replaceable carrying portion, the replaceable carrying portion as well as the defective electronic element can be removed and replaced with good ones.

8 Claims, 7 Drawing Sheets

(56) References Cited

U.S. PATENT DOCUMENTS

| | | | |
|---|---|---|---|
| 5,835,781 A * | 11/1998 | Van de Steeg et al. | 712/1 |
| 6,320,756 B1 * | 11/2001 | Ikeda | 361/760 |
| 6,481,098 B1 * | 11/2002 | Lin Chen | 29/829 |
| 6,638,592 B1 * | 10/2003 | Schulz-Harder | 428/43 |
| 7,000,845 B2 * | 2/2006 | Welling et al. | 235/492 |
| 7,008,236 B2 * | 3/2006 | Wabiszczewicz | 439/65 |
| 7,036,214 B2 * | 5/2006 | Kondo et al. | 29/830 |
| 7,143,492 B2 * | 12/2006 | Chen | 29/402.08 |
| 7,445,944 B2 * | 11/2008 | Tong et al. | 438/4 |
| 7,559,138 B2 * | 7/2009 | Sin | 29/830 |
| 7,592,551 B2 * | 9/2009 | Naito et al. | 174/250 |
| 7,649,143 B2 * | 1/2010 | Ohsawa et al. | 174/254 |
| 8,017,871 B2 * | 9/2011 | Naito et al. | 174/262 |
| 8,354,596 B2 * | 1/2013 | Takahashi | 174/254 |
| 8,519,270 B2 * | 8/2013 | Chang | 174/250 |
| 8,536,457 B2 * | 9/2013 | Takahashi | 174/254 |
| 2007/0187844 A1 * | 8/2007 | Chen | 257/789 |
| 2007/0253179 A1 * | 11/2007 | Briggs | 361/808 |
| 2009/0184407 A1 | 7/2009 | Arvin et al. | |
| 2009/0290318 A1 * | 11/2009 | Takahashi | 361/792 |
| 2010/0132980 A1 * | 6/2010 | Takahashi | 174/250 |
| 2010/0139967 A1 * | 6/2010 | Takahashi | 174/262 |
| 2012/0160555 A1 * | 6/2012 | Thumser et al. | 174/262 |
| 2012/0275124 A1 * | 11/2012 | Pludra et al. | 361/749 |
| 2013/0003314 A1 * | 1/2013 | Igarashi et al. | 361/719 |
| 2013/0025914 A1 * | 1/2013 | Naganuma et al. | 174/251 |
| 2013/0025925 A1 * | 1/2013 | Naganuma et al. | 174/262 |
| 2013/0194765 A1 * | 8/2013 | Cho et al. | 361/764 |
| 2013/0299223 A1 * | 11/2013 | Yoo et al. | 174/259 |
| 2014/0177220 A1 * | 6/2014 | Miyata | 362/235 |

OTHER PUBLICATIONS

TW I251927 English abstract.

* cited by examiner

ELECTRONIC DEVICE AND FABRICATION METHOD THEREOF

REFERENCE TO RELATED APPLICATION

This application claims foreign priority under 35 U.S.C. §119(a) to Patent Application No. 101149706, filed on Dec. 25, 2012, in the Intellectual Property Office of Ministry of Economic Affairs, Republic of China (Taiwan, R.O.C.), the entire content of which patent application is incorporated herein by reference.

BACKGROUND OF THE INVENTION

1. Field of the Invention

The present invention relates to electronic devices and fabrication methods thereof, and more particularly, to an electronic device and a fabrication method thereof for facilitating reworking.

2. Description of Related Art

Generally, semiconductor packages, such as CPUs and memories, are disposed on printed circuit boards of electronic products (such as computers) and the printed circuit boards serve as communication interfaces for various kinds of electronic elements, such as I/O devices, multimedia and communication devices, thereby connecting the semiconductor packages to external devices so as to form a complete electronic system.

In the development of semiconductor technologies, various package types have been developed for semiconductor products. For example, BGA (ball grid array) semiconductor packages that have reduced IC areas, high density and multiple connections have become the mainstream in the market of semiconductor packages. Further, to obtain much lighter, thinner, shorter and smaller semiconductor packages, chip scale packages (CSP) are developed, which are characterized in that the package size is equal to or slightly larger than the size of a chip.

Conventionally, an underfilling process is performed to bond a BGA type chip scale package to a circuit board. However, voids, overflow or insufficient underfilling easily occurs during such an underfilling process. Further, since the underfilling material is made of a thermosetting polymer, when it is cured after being heated, it becomes difficult to rework. Therefore, if a defect occurs to the package or the underfilling material, the entire circuit board must be discarded.

To facilitate reworking, Taiwanese Patent No. I251,927 discloses a detachable base. A package can be disposed on the detachable base and then the detachable base with the package can be disposed on a circuit board. If a defect occurs to the package, the detachable base as well as the package can be detached and replaced with good ones, thereby eliminating the need to discard the entire circuit board.

However, the detachable base occupies spaces on the circuit board, incurring an increase of the area and height of the circuit board and hindering miniaturization of electronic products. Further, to facilitate detachment of the detachable base, the detachable base has a limited number of pins, thus limiting the increase of the number of connection pins between the circuit board and the package and making it difficult to meet the multi-function requirement of electronic products. In addition, the use of the detachable base incurs a high cost.

In view of the above-described drawbacks, FIG. 4A to FIG. 4C show a reworking method disclosed in US Patent Application Publication No. 20090184407. Through such a reworking method, a defective package or a defective underfilling material can be replaced without the need to discard the entire circuit board or the need of a detachable base.

Referring to FIG. 4A, a semiconductor package 11 is flip-chip disposed on a circuit board 10 through a plurality of first solder balls 12 and an underfilling material 13 is formed between the semiconductor package 11 and the circuit board 10 for encapsulating the solder balls 12. If a defect occurs to the semiconductor package 11, the semiconductor package 11 can be removed by grinding.

Referring to FIG. 4B, when the semiconductor package 11 is removed, upper portions of the underfilling material 13 and the first solder balls 12 are also removed (or the underfilling material 13 and the first solder balls 12 can be completely removed) and the remaining lower portions of the first solder balls 12 serve as electrical contacts 12'.

Referring to FIG. 4C, another semiconductor package 11' is flip-chip disposed on the electrical contacts 12' through a plurality of second solder balls 14 and an underfilling material 15 is formed to encapsulate the second solder balls 14.

In the above-described reworking method, a mechanical grinding process is performed to remove and replace the semiconductor package 11 so as to eliminate the need to discard the entire circuit board 10 and meet the miniaturization and multi-function requirements of electronic products.

However, the grinding process is quite complicated and therefore is costly and time-consuming. Further, the grinding depth is difficult to control, which easily leads to an uneven surface of the underfilling material 13' and a poor coplanarity between the electrical contacts 12', thus causing a tilted bonding of the semiconductor package 11' to the circuit board 10 and even causing an offset of the joints between the semiconductor package 11' and the circuit board 10.

Furthermore, an error due to the grinding accuracy may cause damage of circuits or copper pads on the circuit board 10.

Moreover, the grinding process produces a lot of particles that may pollute other elements (not shown) on the circuit board 10.

In addition, although an underfilling material having a low viscosity and a high CTE (coefficient of thermal expansion) facilitates removal of the semiconductor package, its low viscosity cannot meet the reliability requirement of the package assembly. Therefore, such an underfilling material cannot be used.

Therefore, there is a need to provide an electronic device and a fabrication method thereof so as to overcome the above-described drawbacks.

SUMMARY OF THE INVENTION

In view of the above-described drawbacks, the present invention provides a method for fabricating an electronic device, which comprises the steps of: providing a circuit board having a base with at least a block, wherein the at least a block is used as a replaceable carrying portion; and disposing an electronic element on the replaceable carrying portion and electrically connecting the electronic element to the circuit board.

In accordance with the present invention, the method can further comprise removing the replaceable carrying portion (and the electronic element) so as to form a receiving portion on the circuit board, and receiving another carrying portion (and another electronic element) in the receiving portion.

The present invention further provides an electronic device, which comprises: at least an electronic element; and a circuit board having a base with at least a block, wherein the at least a block is used as a replaceable carrying portion for carrying the electronic element, and the electronic element is electrically connected to the circuit board.

According to the present invention, when a defect occurs to the replaceable carrying portion, the replaceable carrying portion as well as the defective electronic element can be removed and replaced with good ones, thereby eliminating the need to discard the entire circuit board and dispensing with the conventional grinding process and the detachable base. Therefore, the present invention effectively achieves reworking and reduces the fabrication cost.

BRIEF DESCRIPTION OF DRAWINGS

FIG. 2A to FIG. 2C are schematic top views showing a method for fabricating an electronic device according to a second embodiment of the present invention, wherein FIG. 2B is a side view of FIG. 2A.

FIG. 3A to FIG. 3G are schematic top views showing a method for fabricating an electronic device according to a third embodiment of the present invention, wherein FIG. 3C is a cross-sectional view of FIG. 3B, FIG. 3E is a cross-sectional view of FIG. 3D, and FIG. 3G is a cross-sectional view of FIG. 3F.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "on", "a" etc. are merely for illustrative purposes and should not be construed to limit the scope of the present invention.

Figure 1:
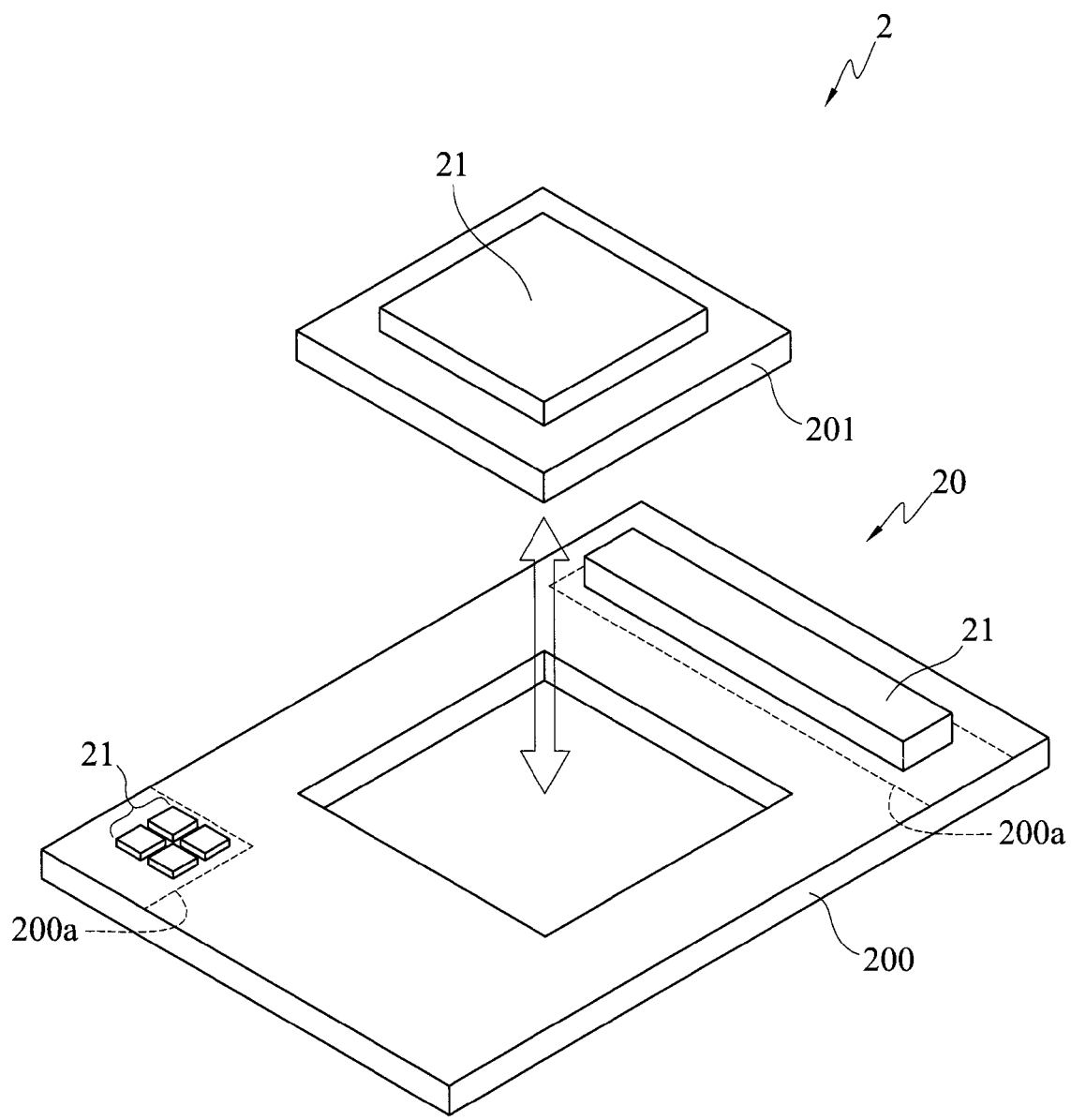
FIG. 1 is a schematic perspective view of an electronic device according to a first embodiment of the present invention.

FIG. 1 is a schematic perspective view of an electronic device 2 according to a first embodiment of the present invention.

Referring to FIG. 1, a circuit board 20 has a plurality of electronic elements 21 disposed thereon. At least a block 200a of the circuit board 20 carrying the electronic elements 21 is defined to be a replaceable carrying portion 201. If a defect occurs in the assembly process, the replaceable carrying portion 201 as well as the defective electronic elements 21 can be removed and replaced.

The circuit board 20 and the electronic elements 21 of the present embodiment can be of various kinds. Since they are well known in the art, detailed description thereof is omitted herein.

Figure 2A:
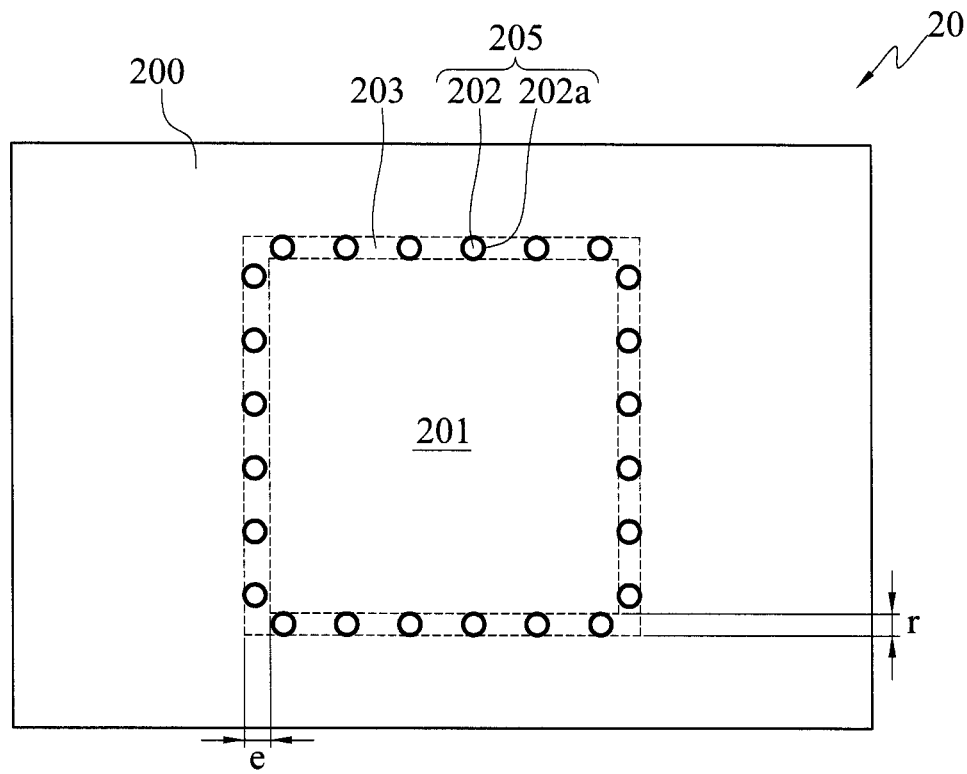
Figure 2B:
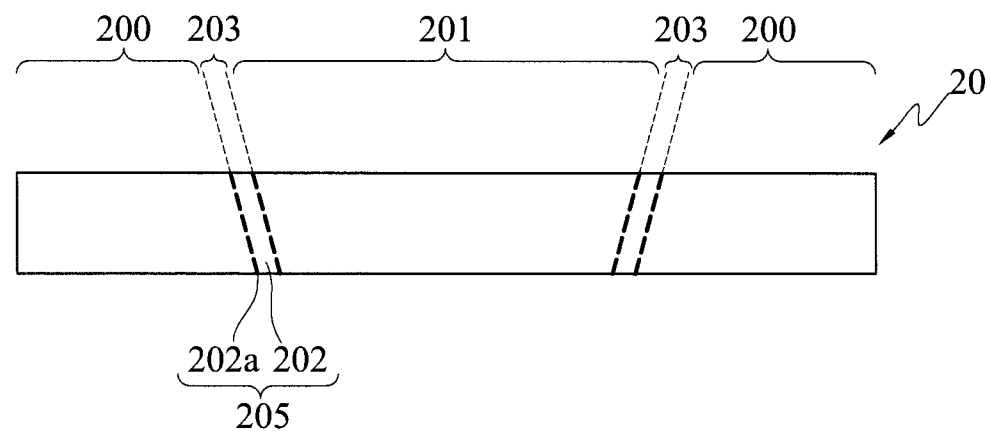
Figure 2C:
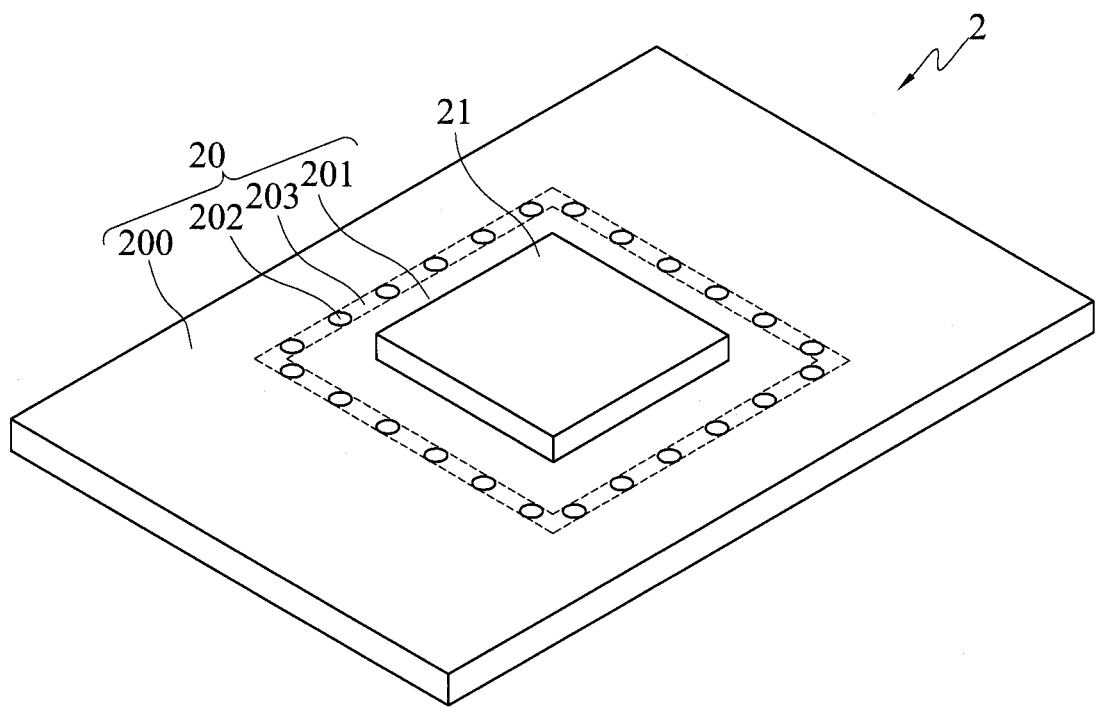

FIG. 2A to FIG. 2C show a method for fabricating an electronic device 2 according to a second embodiment of the present invention. In the present embodiment, by using the concept of perforations of a postal stamp, a plurality of through holes (i.e., pre-cut holes) are formed around a periphery of a block of a circuit board that is to be underfilled so as to make separation of the block more convenient, thus forming a replaceable circuit board block. By replacing the replaceable circuit board block as well as the electronic elements on the block with good ones, a reworking process is finished.

Referring to FIG. 2A and FIG. 2B, a circuit board 20 having a base 200 is provided. A block of the base 200 is defined as a replaceable carrying portion 201, and a region between the base 200 and the replaceable carrying portion 201 is defined as a support portion 203. Then, a plurality of through holes 202 are formed in the support portion 203 along edges of the carrying portion 201. Each of the through holes 202 is formed in the support portion 203 at an oblique angle relative to a surface of the base 200.

In the present embodiment, the circuit board 20 is a common printed circuit board. The base 200, the support portion 203 and the carrying portion 201 are made of the same material and have an integrated structure.

The width e of the support portion 203 is equal to the width r of the through holes 202, and the support portion 203 is of a ring shape that is formed by connecting the projections of the through holes 202, as shown in dashed lines of FIG. 2A and FIG. 2B. In other embodiments, the width of the support portion 203 can be greater than the width of the through holes 202, and the support portion 203 can be of other shapes.

Figure 2D:
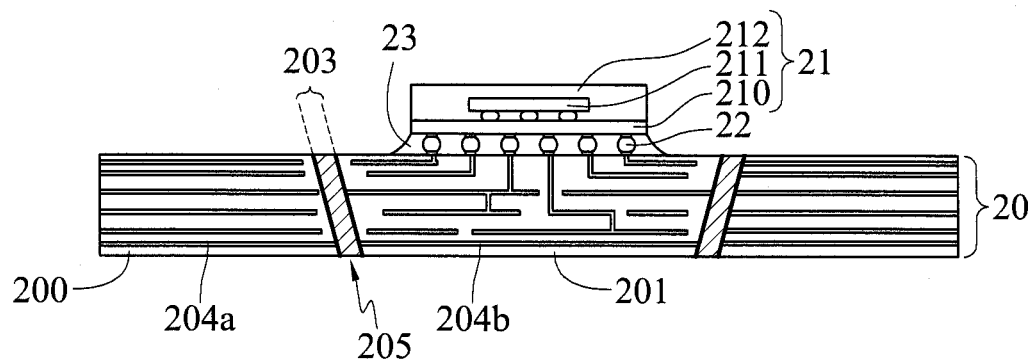
FIG. 2D is a cross-sectional view of FIG. 2C.

Further, a metal material 202a is formed on walls of the through holes 202 so as to form conductive through holes 205 that electrically connect circuits 204b of the carrying portion 201 and circuits 204a of the base 200, as shown in FIG. 2D. In other embodiments, the through holes 202 can be filled with the metal material 202a.

In the present embodiment, the through holes 202 are formed along all the edges of the carrying portion 201. In other embodiments, the through holes 202 can be only formed along one edge, two edges or three edges of the carrying portion 201 according to the practical need. For example, if the carrying portion 201 is at a corner of the circuit board 20, the through holes 202 can be only formed along one or two edges of the carrying portion 201.

Referring to FIG. 2C, an electronic element 21 is disposed on and electrically connected to the carrying portion 201.

In the present embodiment, referring to FIG. 2D, the electronic element 21 is disposed on and electrically connected to the carrying portion 201 through a plurality of conductive bumps 22 such as solder balls arranged in an array. Further, an adhesive material 23 is formed between the electronic element 21 and the carrying portion 201 for encapsulating the conductive bumps 22.

The electronic element 21 is a BGA package, which has a packaging substrate 210, a semiconductor chip 211 disposed on the packaging substrate 210 and an encapsulant 212 encapsulating the semiconductor chip 211. The semiconductor chip 211 is electrically connected to an upper side of the packaging substrate 210 through wire bonding or in a flip-chip manner, and the conductive bumps 22 are formed on a lower side (ball side) of the packaging substrate 210.

In other embodiments, the packaging substrate of the electronic element 21 can be dispensed with. For example, the electronic element 21 can have a stack-type semiconductor chip structure.

Figure 2E:
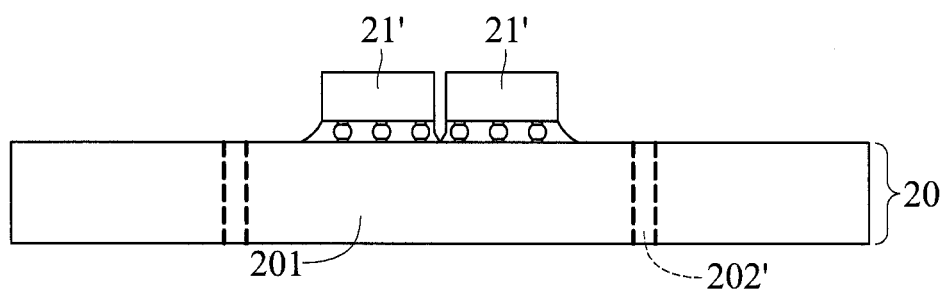
FIG. 2E shows another embodiment of FIG. 2D.

Referring to FIG. 2E, in another embodiment, the through holes 202' are formed perpendicular to the surface of the base 200, and a plurality of electronic elements 21' are disposed on and electrically connected to the carrying portion 21'.

Therefore, if the electronic element 21 is found to be defective, the carrying portion 201 carrying the electronic element 21 can be removed through the through holes 202 by milling or stamping and replaced with another carrying portion 201 having the same structure and carrying a good electronic element 21, thereby finishing a reworking process.

The electronic device 2 of the present invention is applicable to circuit board blocks of electronic products that require an underfilling process (or have packages disposed thereon through array-arranged joints). The electronic products can be, for example, portable electronic products such as notebook computers and smart phones. As such, the present invention avoids the conventional grinding process for reworking. That is, if a reworking process is required for the electronic device 2, only the carrying portion 201 carrying the electronic element 21 needs to be removed and replaced without affecting other regions, such as the base 200, and other elements of the circuit board 20, thereby facilitating the reworking process and greatly reducing the cost.

Further, if the through holes 202 are formed at an oblique angle relative to the surface of the base 200, the carrying portion 201 can be easily removed and replaced and stresses applied on the base 200 can be reduced. Therefore, compared with the through holes 202' perpendicular to the surface of the base 200, the through holes 202 formed at an oblique angle relative to the surface of the base 200 more effectively facilitate removal of the carrying portion 201.

Furthermore, by forming the conductive through holes 205 in the through holes 202 to effectively utilize spaces of the circuit board 20, the present invention reduces the wiring area on the surface of the circuit board 20 and increases the wiring density, thereby increasing the function of the electronic device 2 and meeting the miniaturization requirement of the electronic device 2.

FIG. 3A to FIG. 3G show a method for fabricating an electronic device 3' according to a third embodiment of the present invention.

Figure 3A:
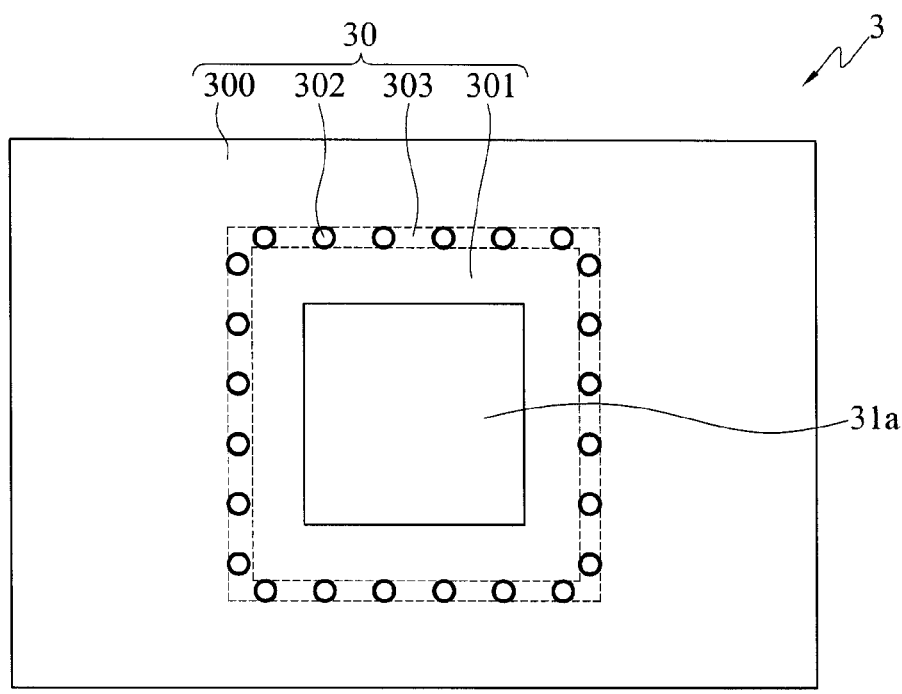

Referring to FIG. 3A, an electronic device 3 having a circuit board 30 is provided. The circuit board 30 of the electronic device 3 has a base 300 and a first carrying portion 301. A plurality of through holes 302 are formed on the base 300 around the first carrying portion 301 so as to define a first support portion 303 connecting the first carrying portion 301 and the base 300. Further, a first electronic element 31*a* is disposed on and electrically connected to the first carrying portion 301.

In the present embodiment, the circuit board 30 and the first electronic element 31*a* have the same structure as in FIG. 2C and therefore detailed description thereof is omitted herein.

Figure 3B:
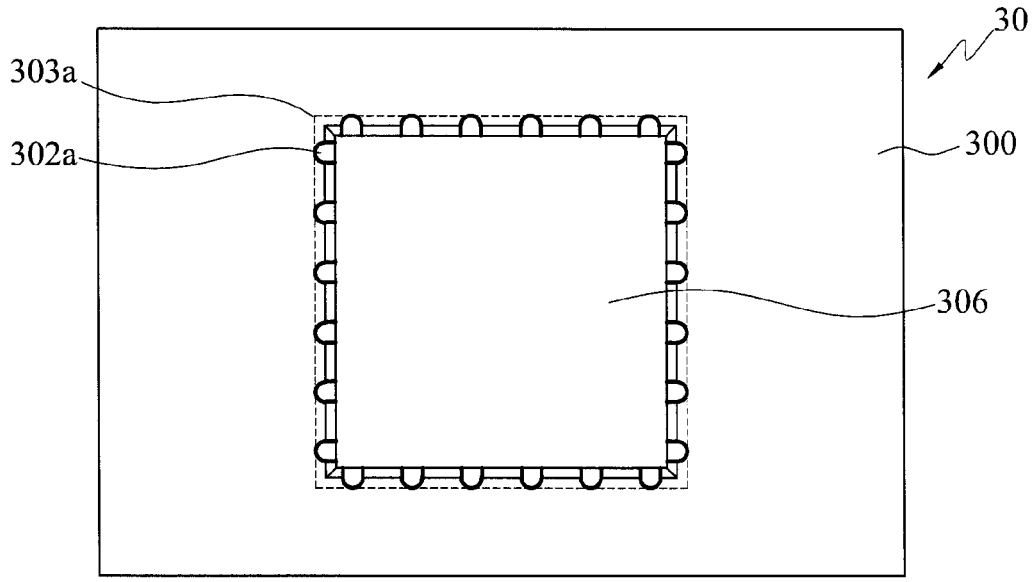
Figure 3C:
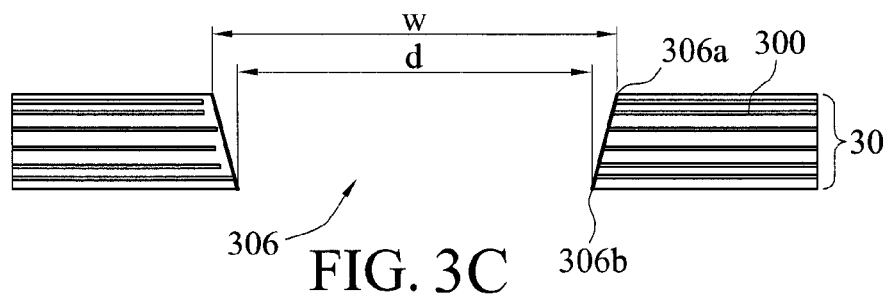

Referring to FIG. 3B and FIG. 3C, if the first electronic element 31*a* or the adhesive material 23 of FIG. 2C is found to be defective, a milling process is performed along a path formed by the through holes 302, i.e., along an edge of the first carrying portion 301, to damage the first support portion 303, thereby removing the first carrying portion 301 and the first electronic element 31*a* so as to form a receiving portion 306 on the circuit board 30.

In the present embodiment, the through holes 302 are formed at an oblique angle relative to the surface of the base 300. As such, the receiving portion 306 has an open end 306*a* and a bottom end 306*b*, and the width w of the open end 306*a* is greater than the width d of the bottom end 306*b*. Preferably, the width of the receiving portion 306 gradually reduces from the open end 306*a* to the bottom end 306*b*.

Further, the first support portion 303 has a remaining structure 303*a* that includes portions of the through holes 302*a*. In other embodiments, the first support portion 303 can be completely removed. That is, the through holes 302 are completed removed.

In other embodiments, the first carrying portion 301 and the first electronic element 31*a* can be removed by stamping from bottom to top.

Alternatively, an upper portion of the first carrying portion 301 can be taken away while keeping a lower portion of the first carrying portion 301. As such, the receiving portion 306 does not penetrate the circuit board 30.

Figure 3D:
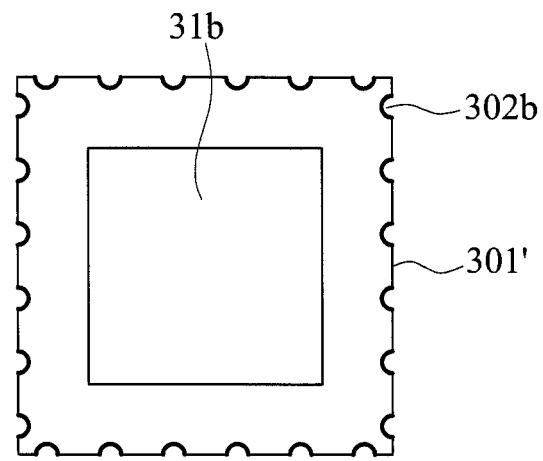
Figure 3E:
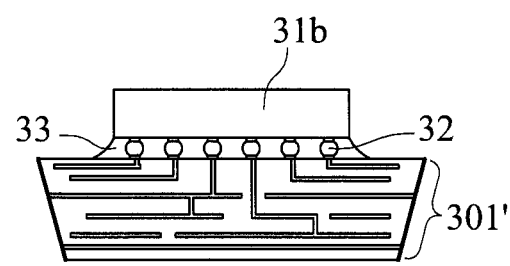
Figure 3E:
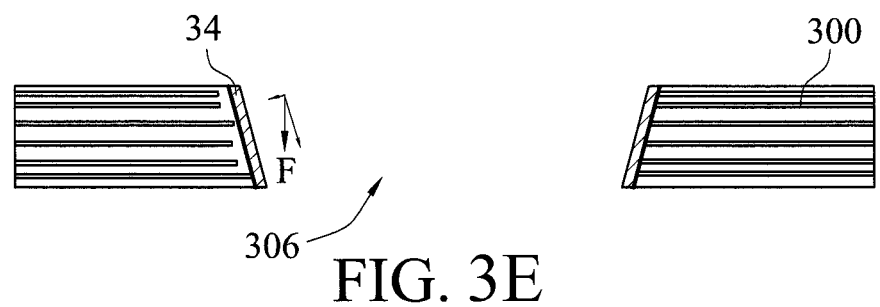

Referring to FIG. 3D and FIG. 3E, a second carrying portion 301' and a second electronic element 31*b* are provided. The second electronic element 31*b* is electrically connected to the second carrying portion 301' and a conductive adhesive 34 is formed on the wall of the receiving portion 306.

In the present embodiment, the second carrying portion 301' is fabricated similar to the first carrying portion 301 and the second electronic element 31*b* is fabricated similar to the first electronic element 31*a*. Therefore, the second carrying portion 301' corresponds in shape to the receiving portion 306. For example, the second carrying portion 301' is of a cone shape and has a through hole structure 302*b* corresponding to the through holes 302*a*.

Further, referring to FIG. 3E, the second electronic element 31*b* is flip-chip disposed on the second carrying portion 301'. That is, the second electronic element 31*b* is disposed on and electrically connected to the second carrying portion 301' through a plurality of conductive bumps 32 such as solder balls. Further, an adhesive material 33 is formed between the second electronic element 31*b* and the second carrying portion 301' for encapsulating the conductive bumps 32.

The conductive adhesive 34 is an anisotropic conductive film (ACF). In other embodiments, a metal material can be formed on the wall of the receiving portion 306.

Figure 3F:
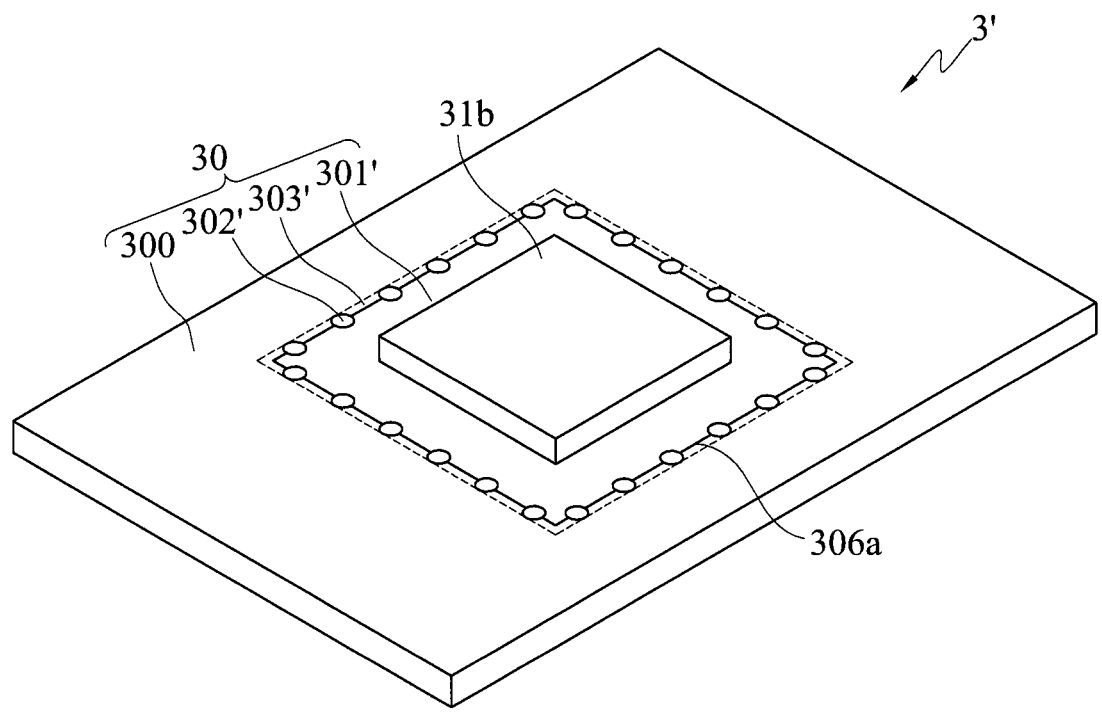
Figure 3G:
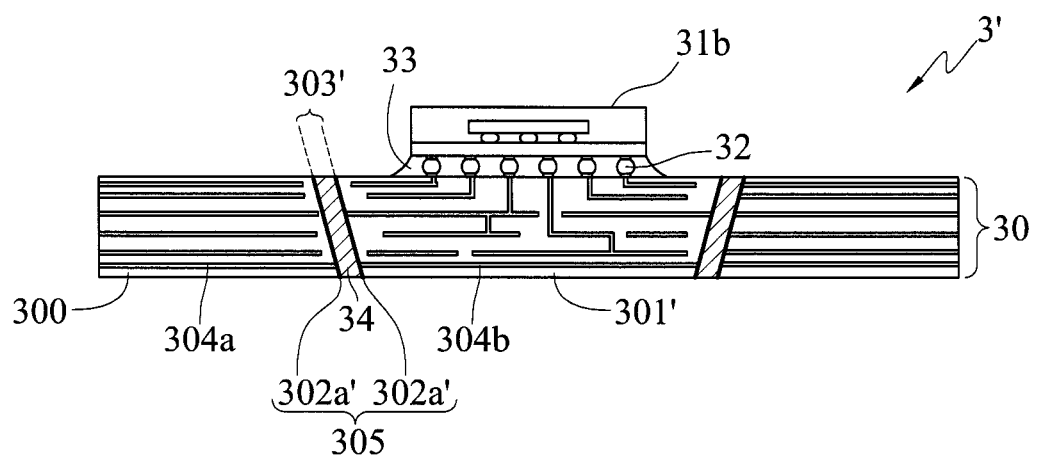
Figure 4A:
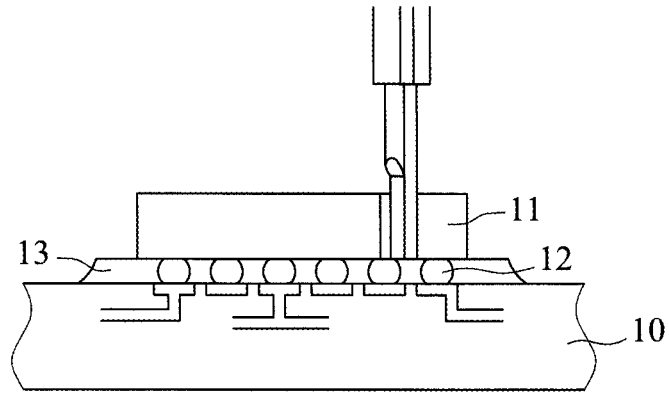
FIG. 4A to FIG. 4C are schematic cross-sectional views showing a method for reworking an electronic device according to the prior art.
Figure 4B:
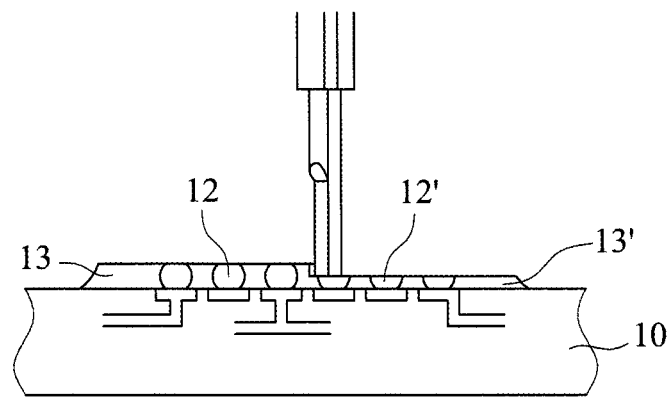
Figure 4C:
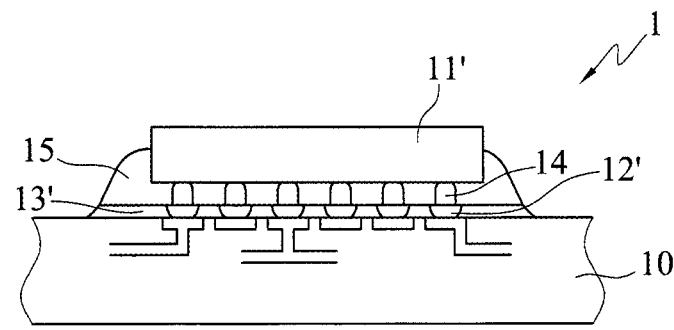

Referring to FIG. 3F and FIG. 3G the second carrying portion 301' is received in the receiving portion 306 with the second electronic element 31*b* located at the open end 306*a* of the receiving portion 306.

In the present embodiment, the through holes 302*a* and the corresponding through hole structure 302*b* of the second carrying portion 301' form a plurality of through holes 302'. The through holes 302' have the remaining or newly filled metal material 302*a'* and the conductive adhesive 34 therein, thus forming conductive through holes 305. The remaining structure 303*a* and the conductive adhesive 34 form a second support portion 303'. The circuits 304*b* of the second carrying portion 301' and the circuits 304*a* of the base 300 are electrically connected through the conductive adhesive 34 (or the conductive through holes 305) of the second support portion 303'.

Since the anisotropic conductive film is used in the present embodiment, the receiving portion 306 needs to have a tapered shape such that a vertical pressing force F is generated by the taper angle of the second carrying portion 301' and applied on the anisotropic conductive film, as shown in FIG. 3E. Consequently, the conductive particles of the anisotropic conductive film come into contact with each other so as to electrically connect the circuits 304*b* of the second carrying portion 301' and the circuits 304*a* of the base 300, thus allowing signal communication. Since the anisotropic conductive film is well known in the art, detailed description thereof is omitted herein.

Further, since the width w of the open end 306*a* is greater than the width d of the bottom end 306*b* of the receiving portion 306, the second carrying portion 301' can be securely embedded in the receiving portion 306 so as not to fall off.

In addition, if the through holes 302 are formed perpendicular to the surface of the base 300, as shown in FIG. 2E, the wall of the receiving portion 306 will be perpendicular to the surface of the base 300. Therefore, the bottom end 306*b* of the receiving portion 306 must have a carrying structure (not shown) for disposing the second carrying portion 301'.

In a subsequent test, if the second electronic element 31b or the adhesive material 33 is found to be defective, the second carrying portion 301' can be removed from the receiving portion 306 for reworking.

According to the present invention, a replaceable carrying portion is defined with, for example, a plurality of through holes there around so as to facilitate the reworking process. As such, the present invention overcomes the conventional drawbacks such as damage and pollution caused by the conventional grinding process, increases the wiring density and meets the miniaturization requirement of electronic products. In addition, the present invention can use an underfilling material (i.e., an adhesive material) having a high viscosity and a low CTE so as to ensure the assembly reliability of the electronic device.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic device, comprising:
    at least an electronic element;
    a circuit board, having at least a block and a base with a receiving portion for receiving the block, wherein the receiving portion has an open end and a bottom end, the open end being wider than the bottom end, and wherein the at least a block is used as a carrying portion for carrying the electronic element, a plurality of through holes are formed between the block and the base, the through holes are formed at an oblique angle relative to a surface of the base, and the electronic element is electrically connected to the circuit board; and
    an anisotropic conductive film formed in the through holes and electrically connected to the block and the base.

2. The device of claim 1, wherein the through holes is further filled with a metal material so as to form a plurality of conductive through holes.

3. The device of claim 1, wherein the receiving portion corresponds in shape to the block so as to receive the block.

4. The device of claim 1, wherein the electronic element is disposed in an array and electrically connected to the block.

5. A method for fabricating an electronic device, comprising the steps of:
    providing a circuit board having a base, wherein the base has at least a replaceable carrying portion;
    forming a plurality of through holes between the replaceable carrying portion and the base along an edge of the replaceable carrying portion, wherein the through holes are formed at an oblique angle relative to a surface of the base;
    disposing an electronic element on the replaceable carrying portion and electrically connecting the electronic element to the circuit board;
    removing the replaceable carrying portion and the electronic element through the through holes so as to form a receiving portion on the circuit board, wherein the receiving portion has an open end and a bottom end, the open end being wider than the bottom end; forming an anisotropic conductive film on a wall of the receiving portion; and
    receiving another carrying portion in the receiving portion, wherein the anisotropic conductive is film formed between the another carrying portion and the base, and the another carrying portion is electrically connected to the base through the anisotropic conductive film.

6. The method of claim 5, wherein the another carrying portion corresponds in shape to the receiving portion.

7. The method of claim 5, further comprising the steps of: disposing and electrically connecting another electronic element to the another carrying portion.

8. The method of claim 5, further comprising forming a metal material in the through holes so as to form a plurality of conductive through holes for electrically connecting the replaceable carrying portion and the base so as to remove the conductive through holes while removing the replaceable carrying portion and the electronic element through the through holes.

* * * * *